HIGH STABILITY ASTABLE MULTIVIBRATOR OSCILLATOR

Filed Nov. 21, 1966 2 Sheets-Sheet 1

INVENTOR
BRUCE E. PONTIUS
BY
[signature]

April 9, 1968 B. E. PONTIUS 3,377,567

HIGH STABILITY ASTABLE MULTIVIBRATOR OSCILLATOR

Filed Nov. 21, 1966 2 Sheets-Sheet [illegible]

INVENTOR
BRUCE E. PONTIUS
BY

United States Patent Office 3,377,567
Patented Apr. 9, 1968

3,377,567
HIGH STABILITY ASTABLE MULTIVIBRATOR OSCILLATOR

Bruce E. Pontius, Riverside, Calif., assignor to Bourns, Inc., a corporation of California Filed Nov. 21, 1966, Ser. No. 595,807
9 Claims. (Cl. 331—113)

ABSTRACT OF THE DISCLOSURE

A voltage-controlled astable multivibrator oscillator the oscillation frequency of which varies with variation of an applied control voltage, characterized by insensitivity to changes of ambient temperature and power-supply potential, utilizing high-gain differential amplifier means in the switching circuits to avoid need for temperature compensating means, and potential-clamping means to obviate operational changes incident to fluctuation of power-supply potential.

The invention herein disclosed pertains to improvements in solid-state voltage-controlled oscillators (VCO) of the astable or free-running multivibrator type characterized by frequency-dependence upon an applied modulating potential which represents information to be transmitted. Such oscillators generally have a mid-frequency of oscillation when the modulation or input potential is zero, and an operating frequency band extending equally above and below the mid-frequency value. More particularly the invention pertains to improvements in the named class of oscillators in which circuit arrangements are made whereby gross freedom from frequency-change incident to temperature variation and/or supply voltage change is attained and whereby immediate and positive oscillatory operation occurs incident to application of power to the oscillator unit.

Multivibrator oscillators are well known in the electronic arts, as are astable multivibrators utilizing transistor devices as substitutes for the older vacuum-tube devices. Examples of the former are disclosed, for example, at pages 8–2 and 8–28 of "Electronic Designers Handbook" authored by Landee, Davis and Albrecht and published by McGraw-Hill Book Company in 1957. More recently, in addition to general substitution of transistor devices for vacuum tube devices, certain ones or groups of the circuit elements have been constructed as "integrated" structures comprising resistive and semiconductive films deposited on small ceramic insulation wafers or "chips," for the purpose of reducing the size and mass of the circuits. The present invention is especially directed to the latter type of circuit construction as made or applied for production of an output signal the frequency of which varies in accord with variation of the potential of a modulating input signal.

The common use of a multivibrator as a voltage-controlled oscillator is a natural choice due to the high inherent accuracy and linearity possessed by that type of circuit. In a VCO system, power is supplied to an input voltage regulator circuit from a power source, and the oscillator is connected to the regulator circuit and is thus supplied well-regulated potential. The output of the oscillator is passed through a low-pass active filter network where undesired A.C. components are removed from the output signal. Of the three interconnected system components just mentioned, the oscillator is the critical component, upon which performance is principally predicated.

The three principal parameters of oscillator performance are: (a) linearity of output, (b) modulation sensitivity, and (c) mid-frequency. Prior art multivibrator VCO circuits having solid-state active components suffered certain deficiencies, those of significant importance being drift of center-frequency (zero drift) and, more importantly, change of modulation sensitivity with change of temperature and time. The greater the range of temperature over which the oscillator is intended to be operable, the greater is the difficulty in limiting the changes to acceptable limits. As will be explained in more detail later herein, resort has been had to various expedients in efforts to compensate or nullify the effects of temperature changes on such oscillators. As will also be illustrated and explained, all such efforts have succeeded to some extent in restricting to tolerable degree the mid-frequency shift with change of temperature over rather narrow temperature ranges; but only at the expense of inclusion of several temperature-sensitive active elements and at the expense of much time-consuming and tedious selection and adjusting of variable components.

Effects of age upon oscillator mid-frequency have generally been ignored. By "temperature compensate" or "temperature compensation" as used herein, is meant the physical modification or adjustment of the circuit arrangement and components which has to be effected in order to obtain the desired degree of uniformity of circuit operation between prescribed temperature extremes.

VCO circuits are usually sensitive to supply-voltage fluctuations, hence part of the allowable error band must be allocated to the voltage regulator supplying the VCO. Thus, if the generally desired value of stability of frequency of oscillation is to be attained, the oscillator per se has to be stable within about 15 cycles per megacycle per degree centigrade. Such a high degree of stability is necessary because in practical applications of VCO circuits the frequency modulation is only ±7.5% of the mid-frequency value, the latter being the frequency corresponding to input signal voltage value of zero. Thus it is noted that a .15% shift in mid-frequency is equivalent to a change of 1% in terms of the design band width equal to 15% of mid-frequency value.

Typically, the VCO is as noted an astable multivibrator circuit, operating in the saturation mode. In such circuits the half-period, T, of an oscillation cycle is defined by the equation:

$$T=RC\log\left[\frac{V_{BB}+I_{BL}R-V_{CE(SAT)}+V_{CC}-I_{CL}R_C-V_{BE(SAT)}}{V_{BB}+I_{BL}R-V_{TH}}\right] \quad \text{(I)}$$

wherein:

$I_{BL}$=transistor base reverse leakage current;
$I_{CL}$=transistor collector leakage current;
$V_{TH}$=transistor "turn-on" threshold voltage, which is equal to the diode barrier potential increased by a current-gain-dependent factor;
$V_{CE}$=transistor collector-to-emitter potential drop at saturation;
$V_{BE(SAT)}$ is the saturation value of the base to emitter potential;
R and C are, respectively, the resistance and capacitance values in the timing (charging) circuits of the multivibrator transistors; and
$V_{BB}$ is the base return resistor potential.

If low-leakage planar transistors are used as the active multivibrator (MVB) elements, the leakage components of Equation I can be neglected since their effects in timing are small in comparison with those of the saturation and threshold voltages. In that case, the effective equation for the oscillator period becomes:

$$T=RC\log\left[\frac{V_{BB}-V_{CE(SAT)}+V_{CC}-V_{BE(SAT)}}{V_{BB}-V_{TH}}\right] \quad \text{(II)}$$

Applying Equation II to a typical prior art MVB oscillator shows that a change greater than 10% of design band width per 100° C. will be experienced in both center frequency and modulation sensitivity. Further, the changes in the noted parameters are logarithmic with respect to temperature. As a consequence, temperature compensation of such non-linear drifts or changes is very difficult and time-consuming, and can be effected over only part of a desired wide operating temperature range. The problem is worsened by the general requirements in the art that high resistance values be used, which thus magnify the effects of leakage currents and of changes in current gains of the transistors.

Various techniques or procedures have been developed for effecting temperature compensation of MVB type VCO units, all of which procedures require a plurality of "temperature runs" or tests at high, low and intermediate temperatures of the range specified. In some instances, compensation such as to permit operation within an error band of 15 cycles per million per ° C. is found to be impossible. Compensation may be effected to provide very small frequency drift at mid-frequency of the operating frequency band, but then the modulation sensitivity changes rather drastically with temperature variation. Similarly, compensation may be effected to produce very small modulation sensitivity drift with temperature change, but then the mid-frequency drift is excessive. Attempts to compensate by changing circuit potential levels with temperature change results in compensation which is voltage modulation sensitive. Experimentation has shown that a two-transistor MVB can be adequately compensated only by compensating for zero drift and for sensitivity drift independently; and since the compensations interact, that is accomplished only with great difficulty. Thus it is evident that a VCO circuit which requires little or no individual temperature compensation would be very desirable.

Analysis of the operation of prior art astable solid-state (transistorized) multivibrator oscillators indicate the following: (*a*) The multivibrator (MVB) comprises essentially a pair of switching devices and a pair of substantially similar resistance-capacitance (R-C) circuits, the charging rate of which is theoretically a specific logarithmic function with respect to time, but which actually occurs in accord with a functional relationship which deviates from the theoretical logarithmic function to various extents depending upon the ambient temperature. (*b*) The switching devices (transistors) are temperature-sensitive in several ways, as hereinbefore explained. As temperature varies, the threshold value of the base-to-emitter potential at which the transistor is triggered into the conductive state changes. (*c*) Nothing is provided in the circuitry to positively start oscillation when power is first supplied to the circuit.

In accord with conclusions derived from the above-outlined analyses, means for attaining novel and unobvious results are provided. Thus in accord with one feature of the invention, the equivalent of the base-to-emitter saturation potential is maintained substantially invariable at, for example, 1.60 volts as by special clamping-circuit means. Further, means are provided having the added advantage of positive starting of oscillation in the MVB. Also in accord with the invention, a pair of high-gain differential amplifier devices is used in place of the pair of switching transistors previously employed as the switching means in MVB oscillator circuits, which novel amplifier devices overcome, without involving compensating techniques or compensating means, the adverse effect of the noted gross temperature-induced changes of [$V_{BE(TH)}$] in the previously used transistor switches. The changes in oscillation period caused by change of $V_{CE(SAT)}$ of the transistors of the amplifiers incident to change of temperature are minimized by supplying sufficient overdrive to heavily saturate the transistors and thereby lower the magnitude and temperature coefficient of $V_{CE(SAT)}$. This is made possible by the high gain of the amplifiers. Further, according to the invention and incident to use of the noted novel amplifier devices, there is provided a single adjustable means or circuit device which may be used to change circuit parameters to nullify changes in the substantially constant R-C circuits which may occur due to circuit aging or due to initial mismatches in temperature coefficient thereof. The aforementioned novel amplifier devices accomplish the noted result by being, substantially and effectively, constant-threshold solid-state amplifiers, as will be more fully explained hereinafter. The noted single adjustable means or circuit device not only provides for the noted possible adjustment to compensate or correct aging effects, but also permits very accurate voltage division whereby an important threshold potential is maintained at a selected level rather than being permitted to vary.

Principally, the invention overcomes the previously explained difficulties in respect of the temperature-sensitive transistor-switching means of the prior art, by using high-gain differential amplifier means as switching devices. The signal potential applied to the non-inverting input terminals of the amplifiers is made to be constant relative to that appearing at the inverting input terminals by clamp and voltage-divider means. The amplifier means is so arranged that gross reduction is effected in the uncertainty in the time, for a given threshold voltage, at which switching occurs at either of the amplifiers; such uncertainty being due to loading of the charging circuit by the conventional transistor input. Since the invention contemplates either use of monolithic operational amplifiers of known design in cooperative relationship with similar circuitry on a ceramic chip, or, alternatively, most of the entire VCO circuitry in a monolithic element, it will be evident that the cost of the entire circuitry is not substantially more than circuitry as simple as that indicated in prior art publications.

The preceding brief description of the invention and its relationship to the prior art makes it evident that it is a principal object of the invention to provide improvements in voltage-controlled oscillators.

Another object of the invention is to provide an improved astable multivibrator.

Another object of the invention is to provide means whereby the effects of an astable multivibrator of variations of ambient temperature over unusually wide ranges are substantially avoided.

Another object of the invention is to provide a hybrid-circuit solid-state astable multivibrator characterized by exceptional frequency stability over a wide range of temperature variations.

Another object of the invention is to considerably raise the upper frequency limit of operation of astable multivibrator oscillators.

Another object of the invention is to provide means for assuring immediate initiation of oscillation of a multivibrator oscillator.

Other objects and advantages of the invention will hereinafter be set out or made apparent in the appended claims and the following description of a preferred exemplary physical embodiment of the invention as illustrated in the accompanying drawings. In the drawings:

Figure 1:
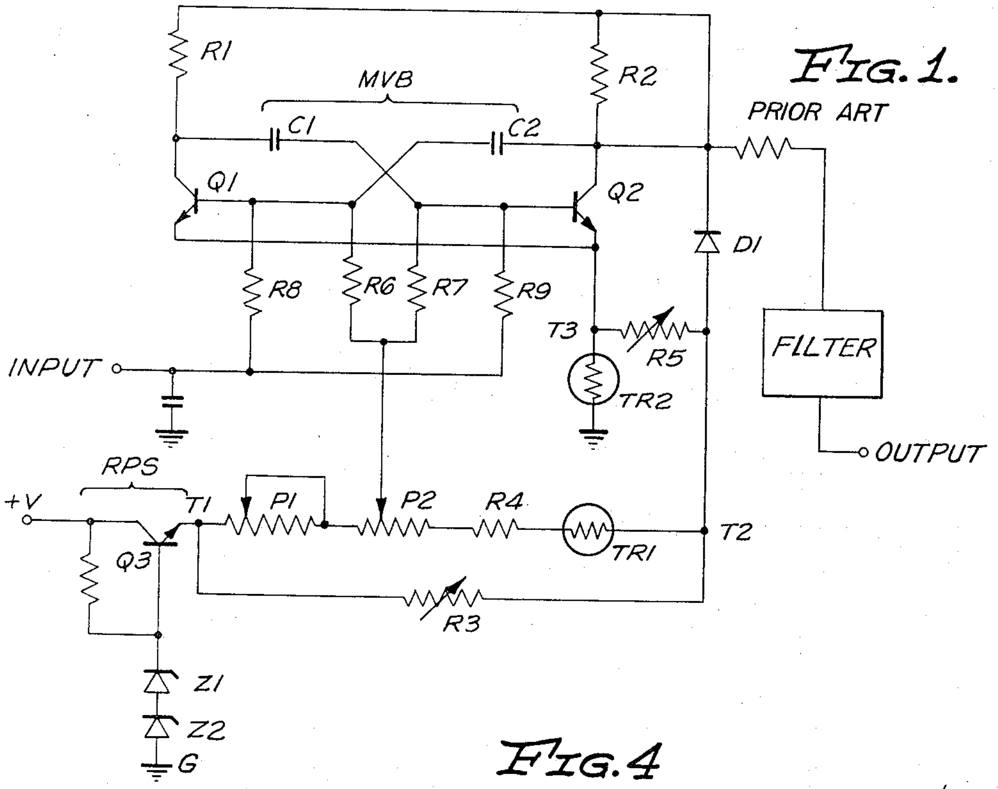
FIGURE 1 is a schematic circuit diagram of an astable multivibrator having a regulated supply of power connected thereto, and having a typical arrangement of temperature-compensation means in the circuitry, according to the prior art.

Referring to FIGURE 1 (illustrative of prior-art VCO circuits), regulated power supplied by power supply unit RPS from potential supplied by a D.C. power source across terminals +V and ground G, appears at terminal T1 (between terminal T and the ground). Potential S for application to the emitter, base, and collector terminals of the two transistors Q1 and Q2 of the multivibrator unit MVB are derived from the potential apparent at terminal T1. The potential for the collectors is derived from a second terminal T2, by way of a diode D1 and resistors R1 and R2. Terminal T2 is supplied potential via a parallel circuit comprising a selected-value resistor R3 in one branch and several potentiometers P1, P2 and resistors R4 and TR1 in series in the second branch. Resistor TR1 is temperature-sensitive and may be of the class known as thermistors. As is known, diode D1 is temperature-sensitive, as are the zener diodes Z1, Z2 and the transistor Q3 of the power supply unit RPS. Potential for the emitters of the switching transistors Q1 and Q2 is supplied from a terminal T3 supplied in turn from terminal T2 by a divider comprising a selected-value resistor R5 and a temperature-sensitive resistor TR2. Base potential for transistors Q1 and Q2 is supplied from the tap of potentiometer P2, by way of resistors R6 and R7. The input (modulating) signal potential is supplied to the bases of transistors Q1 and Q2 via resistors R8 and R9, with a bypass capacitor C3 effective to bypass spurious signals. The MVB unit includes timing-circuit capacitors C1 and C2.

Continuing with reference to FIGURE 1, variations in the base-to-emitter potential drop incident to variations in ambient temperature are compensated to a greater or lesser extent by repetitive judicious "trial and error" selection of resistors R3 and R5, manipulation of potentiometers P1 and P2, and by the compensatory resistance-value drift of the temperature-sensitive components Z1, Z2, Q3, TR1, TR2 and D1. Adjustment and selection of resistors to attain optimum compensation is a vexatious and time-consuming procedure, but permits fair to excellent compensation over a relatively narrow temperature range (25° C.–85° C.). As is evident to those skilled in the art, neither of the selected-value nor of the adjustable components can be changed without altering potentials in other portions of the circuitry; and each such circuit must be individually adjusted. The operation of the circuit in response to varying input signals is, in general, well known to those skilled in the VCO art and need not here be further explained. The same is true of the operations and circuitry of many variations of the multivibrator VCO unit, such as, for example, those detailed in the following prior-art publications: (1) "Motorola Engineering Bulletin," vol. 12, No. 3, (1964) pp. 1–17; (2) "Application Data, APP–37, September 1961," published by Fairchild Semiconductor Division of Fairchild Camera and Instrument Corp., pp. 1–9. Further, the principles and practices of prior-art temperature-compensation are rather fully treated in the following reference publications: (3) Fairchild Semiconductor "Application Data," APP–28/2, September 1961; (4) "Handbook of Semiconductor Electronics" by Lloyd P. Hunter (McGraw-Hill) 1962, pp. 11–67 to 11–82, inclusive; and (5) Texas Instruments Application Notes "Transistor Bias Compensation with Sensistor™ Silicon Resistor," pp. 1–12, inclusive.

Figure 2:
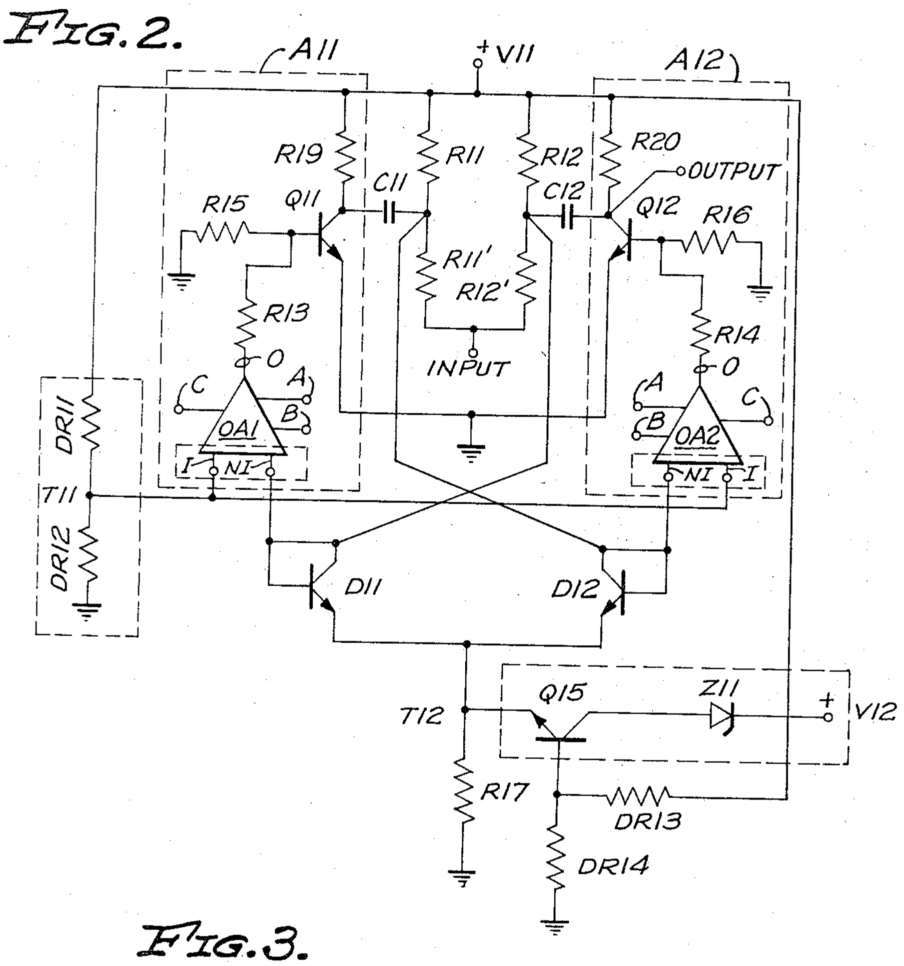
FIGURE 2 is a schematic circuit diagram of an astable multivibrator type of voltage-controlled oscillator according to the invention.

A preferred circuit according to the present invention is shown in FIGURE 2, wherein Q11 and Q12 are transistors comprised in first and second switching means designated generally A11 and A12, respectively, for switching respective RC timing circuits, which latter comprise, respectively, R11, C11 and R12, C12. The collectors of transistors Q11 and Q12, and the RC circuits, are supplied positive potential from a power supply means (not shown) connected to terminal V11 as indicated and to ground and effective to provide power of desired potential. An exemplary potential at terminal V11 is 6 volts. The emitters of transistors Q11 and Q12 are connected to ground, which provides an advantage presently to be made evident. Ground may be, for example, at 0 volt potential. Switching of the dischargeable energy-storing RC circuits is effected by the noted switching means or devices A11–A12 outlined by respective dash-line enclosures in FIGURE 2. The switching devices comprise respective ones of transistors Q11 and Q12, and other portions of first and second high-gain differential amplifier circuitry denoted generally OA1 and OA2, respectively. Each of amplifier circuits OA1 and OA2 may include solid-state circuit components and connections as indicated in detail in FIGURE 3, or equivalent high-gain amplifier circuitry as indicated. The differential amplifiers A11 and A12 have respective inverting input terminals I connected to a terminal T11 of a voltage-divider net that is connected across the potential supply between V11 and ground as indicated and which net comprises dividing resistors DR11 and DR12. The noninverting input terminals NI of the differential amplifier circuits are connected via respective voltage-clamping diode-connected transistors D11 and D12 to a terminal T12, the noninverting terminals NI also being connected to respective RC-circuit capacitors C11 and C12 as indicated. The amplifier sections OA1 and OA2 have their output terminals 0 connected via respective resistors R13, R14 to the bases of respective ones of transistors Q11 and Q12, and to ground via respective ones of resistors R15 and R16.

The potential apparent at the aforementioned terminal T12 is derived from the + potential (e.g., 6 volts) supplied at terminal V11, by means including voltage divider resistors DR13 and DR14, transistor Q15 and resistor R17, the base-emitter diode of Q15 being poled oppositely to the diode structure of either of transistors D11 and D12. The collector of transistor Q15 is connected through a Zener diode Z11 to a + potential terminal V12 which is supplied potential of, for example, 9 volts, by the power supply means previously mentioned. The circuit components noted are chosen so that the potential at the junction of DR13 and DR14 is, for example, 1.60 volts, which voltage (less the drop through base-emitter portion of transistor Q15) appears at terminal T12. The arrangement of diode-connected transistors D11 and D12 with transistor Q15 is that of a potential clamp which clamps the potential thus applied to the NI terminals of the amplifiers. Further, since the diodes presented by transistors D11 and D12 are poled oppositely to the base-emitter diode portion of transistor Q15, the circuit supplying potential to the NI terminals of the amplifiers is automatically corrected for any variations caused by changing temperature, because the potential-drop shifts due to temperature change are in opposition and cancel. This is especially true when the transistors D11, D12 and Q15 are all alike. Thus the potential applied to the input terminals NI of the differential amplifiers by the power supply circuitry is maintained constant by clamping during their respective "on" states, relative to that of terminals V11 and T11; and the circuit components including resistors DR11, DR12, DR13, DR14 and R17 are so chosen that the potential $(V-X)$ at terminals T11 applied to the inverting input terminals I is somewhat lower than that appearing at the noninverting terminals, $(V-X)+Y$ for example, in order to apply adequate "on" drive to the amplifiers. In each instance, the potentials V, X and Y are of the same algebraic sign, X being less than V and Y being less than X. Also, it is evident that that difference in potential is maintained, irrespective of changes of potential at V11.

The amplifier sections depicted at OA1 and OA2 may be of conventional or commercially available form, but preferably they are formed as respective unitary monolithic structures or as a single monolithic structure, and in either case may include in the monolithic structures or structure the transistors Q11 and Q12, the resistors R15 and R16 and the noted potential clamping components. Each of the amplifier sections OA1 and OA2 is comprised of circuit elements and connections as depicted in exemplary form in FIGURE 3, the lettered terminals in the latter drawing corresponding to the like denoted terminals in FIGURE 2. Terminals A are supplied with potential (e.g., +9 volts) from the aforementioned power supply means, and terminals B are grounded. The operation and functioning of the amplifiers as high-gain circuits are per se conventional and known in the art and are accordingly not here further explained.

The operation of the circuitry depicted in FIGURE 2 is as follows: When potential of V volts is initially supplied by the power supply means between terminal V11 and ground, and power thus concurrently supplied to the other terminals from the same source. Zener diode Z11 is not conducting, hence transistor Q15 is not conducting and has no collector current. Therefore, as the voltage at V11 increases from zero value, the voltage at T11 increases faster than the voltage at T12 and the potential at the noninverting input terminals NI of the amplifiers is lower than that at the inverting input terminals I which are supplied via terminal T11. Thus both amplifiers are biased off. As the applied potential rises, Zener diode Z11 breaks down, supplying transistor Q15 with current which raises the potential at terminal T12 and the NI or triggering terminals of the amplifiers to a value higher than that at terminal T11 and the inverting terminals I. This action supplies or produces an electrical transient which positively starts oscillation of the MVB, with one or the other of amplifier sections OA1 and OA2 operating to provide an output, and with one of transistors Q11 and Q12 conducting. Assuming, for example, that Q11 commences conducting first, its collector potential falls from the +V11 terminal value (6 volts, for example) to the collector-emitter saturation potential (ground, or, for example, substantially 0 volts). The negative-going potential drop at the collector of Q11 is coupled through capacitor C11 to the NI terminal of amplifier section OA2, adjacent D12, which causes the potential there to drop from the clamp voltage $(V-X)+Y$ to a negative value. That causes the circuit of amplifier section OA2 to turn (or remain) off, providing a low output signal voltage which biases transistor Q12 off. Capacitor C12 is charged through the collector resistor R20 of transistor Q12, and diode D11 and the NI terminal of amplifier OA1. Capacitor C12 charges toward the potential of terminal V11 on one side and toward the diode (D11) clamp voltage $(V-X)+Y$ on the other side. In the meantime, capacitor C11 is charging through the high resistance of R11 and conducting transistor Q11. As capacitor C11 charges, the potential at the NI terminal of amplifier section OA2 is rising toward the threshold reference potential $V-X$ (e.g., 1.5 volts) established at T11 by divider DR11–DR12; and when the reference potential (e.g., 1.5 volts) is reached, amplifier A12 is triggered and turned on, since the input potential at terminal I of A12 is also the reference potential. As amplifier A12 is turned on, the rising (high) output potential at the output terminal 0 of the amplifier section OA2 drives Q12 to conducting state, and the resultant negative-going potential at the collector terminal of Q12, coupled to the NI terminal of amplifier A11, turns the latter off. Capacitor C12 charges as did capacitor C11, and when the charge on C12 reaches the reference potential (1.5 volts), amplifier A11 is triggered and turned on, and the first cycle of the cyclical operation has been completed. Thereafter the cycle repeats, with the repetition rate altered in accord with the input signal potential applied to the INPUT terminal. Output signal potential pulses, one for each cycle of operation of the MVB, are apparent at the OUTPUT terminal.

The circuitry detailed in FIGURE 2 differs from prior art astable MVB circuits in, among other things, providing constant-switching-threshold amplifier means. The amplifier means are connected in differential mode, that is, are effectively differential amplifiers, whereby parameters are easily and independently adjustable. The amplifier means further comprise high-gain amplifiers as is evident from consideration of FIGURE 3. Also, the circuitry, by incorporating the potential dividers DR11–DR12 and DR13–DR14, uniquely provides the feature of a high degree of neutralization of supply-voltage variation, which would be unobtainable with any prior art circuit. Additionally, aging compensation, if desired, can be easily accomplished by change or adjustment of a single component such as one of resistors DR11 and DR12, and without significantly affecting any other parameter. However, the changes of characteristics of the active components are principally mutually self-canceling or are made to be of no significance by the arrangement of the applied potentials. Also, provision of the Zener diode 11 circuit provides for initial off-biasing of the switches and subsequent creation of a transient for positive self-starting of the oscillator under all conditions and that with the addition of but the one inexpensive diode. The latter component performs the positive starting function without in any way affecting other operational characteristics of the circuitry.

Figure 4:
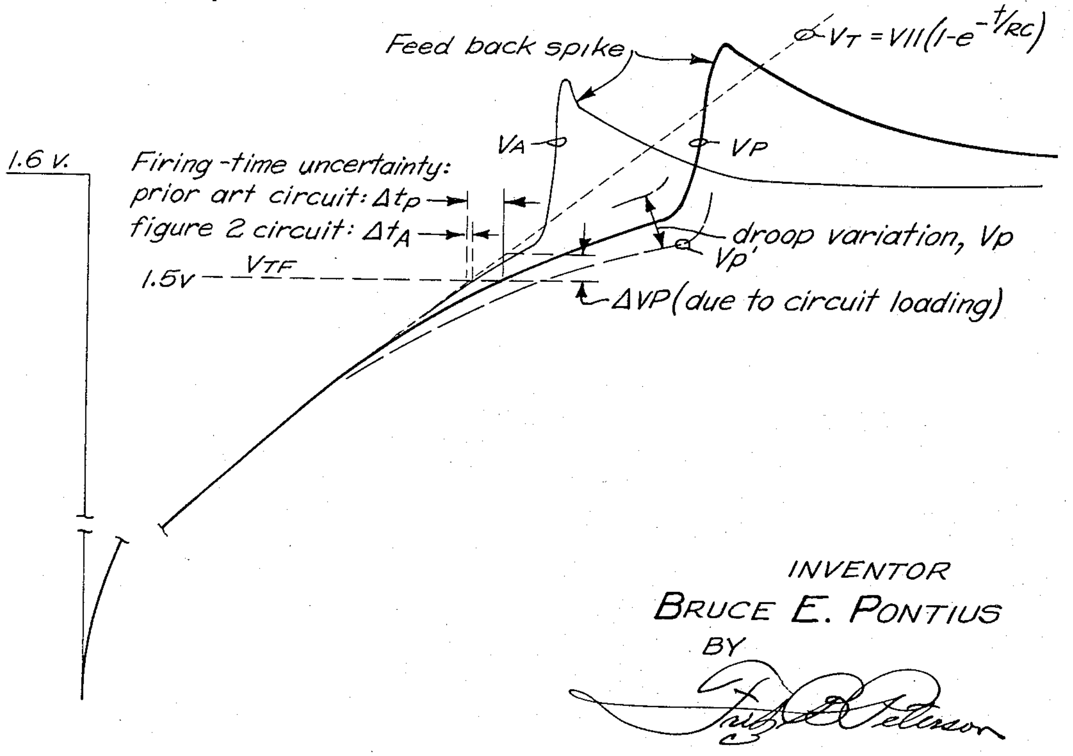
FIGURE 4 is a graphical representation of potentials, relating to the circuits represented in FIGURES 1 and 2, useful in explaining the invention.

The substantially constant switching threshold feature of the circuitry and the gross reduction of the triggering (firing-time) uncertainty is now explained with references to the graphs in FIGURE 4. The basic form of those graphs closely resembles that of the transistor base voltage graph found on page 216 of the well-known text, "Motorola High-Speed Switching Transistor Handbook," and which latter graph has reference to the MVB circuit depicted on page 215 of that reference text. In FIGURE 4, the principal graph is of the potential applied to either of the NI terminals of the switching circuits, that is, of the switching amplifiers A11 and A12. As previously indicated, the potential at either inverting I input terminal of the differential amplifiers is maintained at the reference potential $V-X$, of for example, +1.5 volts; and the potentials apparent at either of the NI input terminals varies (e.g., from a low value of −4.4 volts when the negative-going pulse from the discharge of the opposite capacitor occurs, to a + value $(V-X)+Y$ somewhat greater than the reference potential $V-X$ on the I terminals). The graph commences with the NI terminal potential at clamped value 1.6 volts, greater than the I terminal potential (+1.5 volts), followed in time by a very steep drop to the exemplary value of −4.4 volts incident to discharge of, for example, capacitor C12. Thereafter, as the timing capacitor recharges, the triggering (NI) terminal potential rises, theoretically, in accord with the equation:

$$V_{N1}=V_{11}(1-e^{-t/RC}) \quad . \; . \; . \quad \text{III}$$

as indicated by the dotted line graph, until the actual triggering potential $V_{TF}$ reaches the reference potential (1.5 volts). In practice, the approach of the applied trigger potential to the triggering value does not exactly follow the theoretical equation. As noted, the theoretical values are indicated by the dotted line VT, which is substantially coincident with the actual potential during most of the approach to firing or triggering potential and time, as is evident from the graph. However, the graph of the applied or NI input terminal potential, indicated by the light-weight line VA, droops very slightly below that of the theoretical potential VT during the period of approach to firing potential. Also indicated in the figure, by the heavyweight line VP, is a graph showing growth with time of the base (triggering) potential applied to the prior-art MVB switching transistors, such as Q1 and Q2 of the diagram on page 215 of the aforenoted Motorola Handbook, where it is shown normalized with respect to VA and VT for the purpose of ease of comparison. Due to loading of the circuit by the transistor input in the latter circuitry, there is a considerable droop of the graph of the applied potential, relative to the theoretical value as defined by Equation III above and indicated by graphs $V_T$ and $V_P$, respectively. The droop or deviation is markedly affected by variations of temperature of the circuit, and may be greater (as indicated by graph VP′) or less than that indicated by curve $V_P$. As the temperature varies, the prior art switching transistors variably load the RC circuitry and cause variations of the potential applied to cause switching, which potential follows curves (such as VP) with varying deviations from the theoretical curve VT. In addition, the triggering threshold level varies, as previously mentioned, thereby adding a shift to the above-discussed droop. As a consequence, there is a time period, $\Delta tp$, of uncertain duration, during which triggering of either of the switching transistors occurs by the applied potential reaching the triggering level $V^{TF}$ (1.5 volts in the present example). The measure of the droop of the graph of the potential VP is denoted ΔVP.

Continuing with reference to FIGURE 4 but considering now the excursions of the triggering potential applied to the NI terminals of the amplifiers A11 and A12 of the present invention at the NI terminals, the graph of the applied potential is shown as curve VA. Since, as previously explained, the potential at T11 is constant and since the amplifiers A11 and A12 are low offset drift, high-gain units, the applied trigger terminal potential (VA) follows very closely the theoretical value VT prescribed by Equation III all the way from the most negative value to the triggering value. Thus, as a result of the high gain, the maximum possible triggering-time variation $\Delta tA$, is very small, and is insignificant when compared to that experienced with prior art circuits and illustrated by graph VP. Also, as previously explained, the equivalent of voltage $V_{BE(SAT)}$ has been caused to be constant by the voltage clamping means comprised of components D11, D12 and Q15, and also $V_{CE(SAT)}$ has been caused to remain constant as previously explained. As a consequence, in the absence of the input signal (INPUT) supplying any of the current necessary to charge the timing circuit capacitors (C11, C12), or to bleed charging current when the input signal goes negative, the frequency of oscillation of the MVB remains very constant despite variations of ambient temperature. Further, since the circuit is thus relatively immune to frequency variation incident to temperature variation, the circuit is effectively operable over a much wider temperature range than are prior art VCO's, and is capable of operating satisfactorily at much higher frequencies. For example, the exemplary circuit depicted in FIGURE 2, formed with the resistors and transistors of amplifier sections OA1 and OA2, transistors Q11, Q12, diode-connected transistors D11 and D12, transistor Q15 and resistor R17 all as elements on a monolithic chip, the effective stable-frequency operating range is from −55° C. to +125° C. The latter is a notable improvement over the −20° C. to +85° C. operating temperature range of the better prior-art VCO's. As noted, in the prior art circuits the above-described variations are superimposed on a still larger variation of threshold voltage which is caused by the base-emitter diode-barrier-potential change with temperature. The invention eliminates this source of error by its constant threshold operation afforded by the differential, balanced, connection of amplifiers A11 and A12.

As will be evident to those skilled in the art, variation in the input signal voltage (either above, or below, the zero-voltage input level) will serve either to add to the current supplied to charge the capacitors C11, C12 (as when the signal voltage increases above quiescent value) or to subtract from the charging current (as when the signal potential decreases below quiescent value to a negative potential), and thus will alter the charging rate and hence the time interval during which either capacitor charges to amplifier-firing (threshold) potential. Thus the oscillation period of the circuit is varied by the input signal.

In the circuitry, illustrated in FIGURE 2, charging resistors R11, R12 and input resistors R11′, R12′ are preferably precision fixed resistors. Transistor-diodes D11–D12 and transistor Q15 are as noted very desirably of identical characteristics, whereby temperature-induced changes are substantially entirely canceled. Since the amplifiers and many of the other circuit elements may be formed in situ as parts of a monolithic circuit device and only such elements as capacitors C11, C12 and resistors R11, R12 and R12′ of discrete-component form, the novel astable MVB oscillator circuit is inexpensive yet highly effective.

Figure 3:
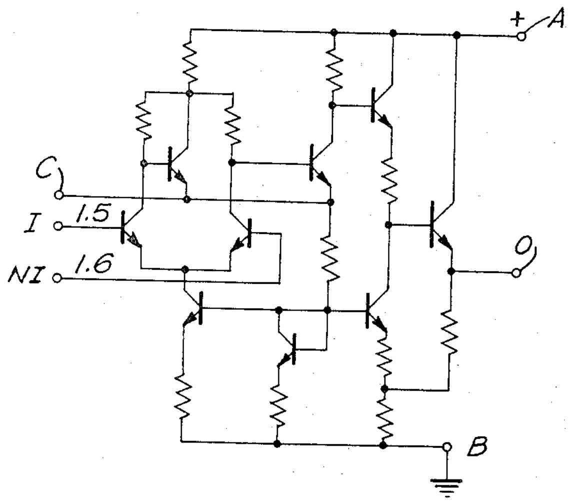
FIGURE 3 is a detailed circuit diagram of amplifier means depicted generally in FIGURE 2.

Component values and characteristics of exemplary circuit elements depicted in schematic form in FIGURES 2 and 3 are as set out in Table I.

TABLE I

| | |
|---|---|
| **Q11** | 2N709 high speed switch. |
| **Q12** | Do. |
| **Q15** | 2N930 or 2N2484. |
| **D11** | Do. |
| **D12** | Any 6 v. zener 2N930 B–E diode. |
| **Z11** | Do. |
| **R11–R12** | 250KΩ metal film. |
| **R11′–R12′** | 1 meg Ω metal film. |
| **R13** | 10KΩ diffused Si. |
| **R14** | Do. |
| **R15** | Do. |
| **R16** | Do. |
| **DR11** | 9KΩ thick film deposited. |
| **DR12** | 3KΩ thick film deposited. |
| **DR13** | 6KΩ thick film deposited. |
| **DR14** | 2KΩ thick film deposited. |
| **R17** | 10KΩ thick film deposited or diffused Si. |
| **R19** | 15KΩ diffused Si. |
| **R20** | Do. |
| **C11** | Ceramic NPO. |
| **C12** | Do. |
| **OA1** | Fairchild μA720 RCA C3008 or similar. |
| **OA2** | Do. |

It is evident from the preceding description that the power supply means supplies operating power and potential by way of a high-potential line or terminal to which terminal V11 is connected and a low-potential line or terminal at a potential below that of the high-potential line or terminal (here the ground), and that amplifier input terminal potentials supplied at the inverting input terminals I and at the noninverting input terminals NI are above that of the low potential line or terminal and below the potential of the high-potential line or terminal V11, whereby the potentials at the solid-state high gain differential amplifier means input terminals (applied in the preferred circuitry via junctions T11 and T12) may together rise and/or fall relative to the potential of the noted lines as fluctuations occur in the power supply potential, and thus providing frequency stability. Thus it is evident that by providing potentials as noted, and by making the circuit arrangements symmetrical so that environment-induced or aging-induced change in one component is offset or compensated by a substantially equivalent change of opposite effect in another component, and by making circuit component arrangements yield parameter dependence upon ratios, coupled with the use of high-gain differential-amplifier switching means in the oscillator, there is attained substantially complete freedom from frequency change or drift incident to temperature change over a very wide temperature range and aging over a long period of time. Further, the upper operational frequency limit attainable is considerably raised over the prior art. Thus, for illustrative examples, as temperature increases, the change in the characteristic values of transistor Q15 is offset by the opposing change in diode-connected transistor D11 or D12; and similarly the same is true in the case of the transistors in each of the differential amplifier units A11 and A12. As noted, the operating characteristics of the principal sub-circuits of the VCO are related by ratios of component characteristic values, rather than by the component values per se.

As a corollary to the foregoing detailed description of a presently-preferred circuit arrangement according to the principles of the invention, and as will now be evident to those skilled in the art, the circuit means including the voltage-clamping circuit means comprising transistors D11, D12, and Q15, and resistors R17, DR13 and DR14, may effectively be embodied in the circuit depicted in FIGURE 3 by appropriate change of values of resistors there shown.

In the light of the present disclosure changes and modifications within the true spirit and scope of the invention will occur to those skilled in the art, and accordingly it is not desired to restrict the scope of the invention to exact details of the illustrated exemplary embodiment or embodiments, other than is required by the appended claims.

I claim:

1. A high-stability astable multivibrator oscillator having a normal oscillation period representable by T, said oscillator comprising:

first means, including a source of electric power of V volts potential, for supplying electric power;

second means, connected to said first means to be supplied electric power therefrom, said second means including first and second time-constant circuits comprising respective capacitive means and respective resistance means through which the respective capacitive means may be charged from said first means;

third means, including first and second solid state electronic switching means connected to said first and second means and each comprising a respective high-gain differential amplifier means, each of which amplifier means comprises a triggering-potential terminal and a reference-potential terminal and each amplifier means connected to discharge a respective one of said capacitive means when triggered by triggering potential at the respective triggering potential terminal;

fourth means, connected to said first means for receiving power therefrom and to said third means for supplying to said reference-potential terminals a potential $V-X$ volts where X is less than V and of the same algebraic sign;

fifth means, connected to said first means for receiving power therefrom and to said third means for supplying a potential $(V-X)+Y$ volts to said triggering-potential terminals during quasi-stable state portions of said period, Y being less than X and of the same algebraic sign; and sixth means, including conductive means cross-connecting said first and second capacitive means to said second and first triggering-potential terminals respectively, whereby upon initiation of conduction by said first switching means said first capacitive means is discharged and the potential at said second triggering-potential terminal is reduced below said potential $(V-X)+Y$ volts and said second switching means is rendered non-conductive, and vice-versa;

whereby the high-gain characteristics of said switching means reduces the triggering-time uncertainty thereof incident to wide variations in ambient temperature to an insignificantly low value to provide substantially constant free-running oscillator frequency over a temperature range from −55° C. to +125° C.

2. A high-stability astable multivibrator oscillator according to claim 1, in which said fourth means comprises a potential-divider circuit and a tap thereon connected to said reference potential terminals.

3. A high-stability astable multivibrator oscillator according to claim 1, in which said fifth means includes, for supplying said potential $(V-X)+Y$, a potential-clamping circuit means, and connection means connecting said clamping circuit means to respective ones of said triggering-potential terminals, to supply to the latter clamped potential of value $(V-X)+Y$.

4. A high-stability astable multivibrator oscillator comprising:

first means, including power means, for supplying electric power of determined potential between a first high potential terminal and a second low potential terminal;

second means, including first and second solid-state electronic high-gain differential switching amplifier means each having first and second differential input terminals;

third means, including first and second RC timing circuits connected to said first means to be charged therefrom and connected to respective ones of said switching amplifier means for discharge thereby incident to switching of the respective amplifier means;

fourth means, including means connected to said first means and to said second means and providing a potential intermediate that of said high and low potential terminals and bearing a constant relationship to that of said high potential terminal, and connection means supplying said provided potential to said first differential input terminals of said switching amplifier means;

fifth means, including means connected to said high potential terminal and to said low potential terminal and to said second differential input terminals of said switching amplifier means, said fifth means comprising potential-clamping means connected to provide to said second differential input terminals a constant reference potential intermediate the potentials of said high and low potential terminals of said first means, said second and third means comprising cross-connecting means effective to cause alternate switching of said first and second switching amplifier means and alternate discharging of said RC circuits to effect free-running multivibrator oscillation thereof, and a connection providing an oscillator output signal, whereby the potentials supplied said first and second differential input terminals are maintained in substantially constant relationship each to the other irrespective of fluctuations of potential difference between said high potential terminal and said low potential terminal of said first means.

5. An oscillator as defined in claim 4, said fifth means including first and second resistive means forming a voltage-dividing circuit connected between said high and low potential terminals of said first means and having a junction between said first and second resistive means, and said fifth means further including serially connected between said junction and either of said second differential input terminals first and second base-emitter diode junctions of similar electronic characteristics connected in opposed relationship whereby drift in base-emitter potential changes incident to changes of ambient temperature in said diode junctions are of opposite sense and effectively offset each other, whereby said oscillator is capable of maintaining a substantially constant free-running mid-frequency of oscillation over a wide range of operating temperatures without introduction of temperature-compensation means.

6. An oscillator according to claim 5 in which said first and second base-emitter diode junctions are in each instance components of first and second transistors of like characteristics.

7. An oscillator according to claim 6, in which said differential switching amplifiers and said transistors are components of a monolithic electronic structure.

8. A high-stability astable multivibrator oscillator comprising:

first means, including a symmetrical electronic multivibrator comprising first and second cross-connected circuits each including a respective RC timing circuit and each including a triggerable high-gain differential amplifier switching means therefor connected thereto and arranged to discharge the capacitor of the respective timing circuit when triggered; and second means, including power supply means having a power supply line and a ground terminal and providing a potential difference therebetween and connecting means connecting the power supply line and ground terminal to said first means to supply potential thereto;

each said switching means comprising a reference-potential terminal and a triggering-potential terminal and each connected to discharge the capacitor of the opposed timing circuit when triggered by application of triggering potential to the triggering-potential terminal thereof, said connecting means including means connecting said power supply line and ground terminal to said reference-potential terminals for supply thereto of a first potential intermediate the potentials of said ground terminal and said power supply line, and said connecting means including potential-clamping means connected to provide to said triggering-potential terminals power at clamped potential intermediate the potentials of said ground terminal and said supply line, whereby upon triggering of either of said switching means the other thereof is biased to nonconductive state by a potential below said first potential and multivibrator oscillation thereby initiated and whereby irrespective of fluctuations of potential difference between said power supply line and said ground terminal the multivibrator oscillation frequency remains constant.

9. A high-stability astable multivibrator oscillator comprising:

first means, including power means, for supplying electric power of determined potential between a first high potential terminal and a second low potential terminal;

second means, including first and second solid-state electronic high-gain differential switching amplifier means each connected to said first means to receive power therefrom and each having inverting and noninverting differential input terminals and incorporating semiconductor and resistive means arranged to maintain the ratio of the difference between the potentials supplied by said first means to said inverting and noninverting differential input terminals substantially constant;

third means, including first and second RC timing circuits connected to said first means to be charged therefrom and connected to respective ones of said switching amplifier means for discharge thereby incident to switching of the respective amplifier means;

said second and third means comprising cross-connecting means effective to cause alternate switching of said first and second switching amplifier means and alternate discharging of said RC circuits to effect free-running multivibrator oscillation thereof, and a connection providing an oscillator output signal, whereby the potentials supplied said inverting and noninverting differential input terminals are maintained in substantially constant relationship each to the other irrespective of fluctuations of potential difference between said high potential terminal and said low potential terminal of said first means.

References Cited

UNITED STATES PATENTS

| | | | |
|---|---|---|---|
| 2,968,008 | 1/1961 | Marenholtz | 331—113 |
| 3,333,213 | 7/1967 | Sheetz | 331—113 X |

JOHN KOMINSKI, *Acting Primary Examiner.*

ROY LAKE, *Examiner.*

S. H. GRIMM, *Assistant Examiner.*

UNITED STATES PATENT OFFICE
CERTIFICATE OF CORRECTION

Patent No. 3,377,567 April 9, 1968

Bruce E. Pontius

It is certified that error appears in the above identified patent and that said Letters Patent are hereby corrected as shown below:

Column 6, line 66, "potential" should read -- potentials --. Column 7, line 14, "source." should read -- source, --. Column 10, TABLE I, first column, line 5 thereof, "D12----Any 6v. zener 2N930 B-E diode." should read -- D12----Do.--; same TABLE I, same first column, line 7 thereof, "Z11--Do." should read -- Z11 Any 6v. zener 2N930 B-E diode. --.

Signed and sealed this 14th day of October 1969.

(SEAL)
Attest:

Edward M. Fletcher, Jr.
Attesting Officer

WILLIAM E. SCHUYLER, JR.
Commissioner of Patents